(12) United States Patent
Nishida et al.

(10) Patent No.: US 8,742,617 B2
(45) Date of Patent: Jun. 3, 2014

(54) BATTERY APPARATUS

(75) Inventors: Takehiko Nishida, Nagasaki (JP);
Katsuo Hashizaki, Nagasaki (JP);
Kazuyuki Adachi, Fukuoka (JP); Shinji
Murakami, Fukuoka (JP); Kouji
Kurayama, Fukuoka (JP); Hirofumi
Fujita, Fukuoka (JP)

(73) Assignees: Mitsubishi Heavy Industries, Ltd.,
Tokyo (JP); Kyushu Electric Power
Co., Inc., Fukuoka-shi (JP)

( * ) Notice: Subject to any disclaimer, the term of this
patent is extended or adjusted under 35
U.S.C. 154(b) by 472 days.

(21) Appl. No.: 13/133,323

(22) PCT Filed: Nov. 30, 2009

(86) PCT No.: PCT/JP2009/070111
§ 371 (c)(1),
(2), (4) Date: Jul. 21, 2011

(87) PCT Pub. No.: WO2010/067724
PCT Pub. Date: Jun. 17, 2010

(65) Prior Publication Data
US 2011/0273023 A1 Nov. 10, 2011

(30) Foreign Application Priority Data
Dec. 9, 2008 (JP) ................ 2008-313524

(51) Int. Cl.
H02J 1/10 (2006.01)
(52) U.S. Cl.
USPC .......................................... 307/29
(58) Field of Classification Search
USPC .......................................... 307/29
See application file for complete search history.

(56) References Cited

U.S. PATENT DOCUMENTS

| 5,952,934 A | 9/1999 | Matsumoto et al. |
| 6,020,717 A | 2/2000 | Kadouchi et al. |
| 2003/0129457 A1 | 7/2003 | Kawai et al. |
| 2009/0130541 A1 | 5/2009 | Emori et al. |

FOREIGN PATENT DOCUMENTS

| EP | 1 806 592 A1 | 7/2007 |
| JP | 9-139237 A | 5/1997 |
| JP | 2000-10902 A | 1/2000 |

(Continued)

OTHER PUBLICATIONS

International Search Report for PCT/JP2009/070111, mailing date of Feb. 2, 2010.

(Continued)

Primary Examiner — Robert L. DeBeradinis
(74) Attorney, Agent, or Firm — Westerman, Hattori, Daniels & Adrian, LLP

(57) ABSTRACT

A battery apparatus includes a row battery group including a plurality of series-connected row batteries including one or more battery cells; a plurality of battery management sections, corresponding to the individual row batteries, for managing the battery statuses of the corresponding row batteries; a central management section for granting unique identification information to the individual battery management sections and acquiring information about the battery statuses of the row batteries from the respective battery management sections for management; second communication lines with which the plurality of battery management sections are daisy-chained; a first communication line with which, of the plurality of battery management sections, the battery management section located at one end is connected to the central management section; and a plurality of connection switching sections, provided in the individual second communication lines between the battery management sections, for switching the connection and disconnection between the battery management sections.

8 Claims, 2 Drawing Sheets

(56) References Cited

FOREIGN PATENT DOCUMENTS

| JP | 2002-110259 A | 4/2002 |
|---|---|---|
| JP | 2003-209932 A | 7/2003 |
| JP | 2004-193643 A | 7/2004 |
| JP | 3549676 B2 | 8/2004 |
| JP | 2009-89486 A | 4/2009 |
| WO | 2007/134320 A1 | 11/2007 |

OTHER PUBLICATIONS

Korean Notice of Allowance dated Apr. 30, 2013, issued in corresponding Korean Patent Application No. 10-2011-7012581, w/ English translation.
Extended European Search Report dated Apr. 7, 2014, issued in corresponding European application No. 09831828.0 (6 pages).
A Decision to Grant a Patent dated Jan. 13, 2014, issued in Chinese Patent Application No. 200980148950.6, with concise English-language explanation of relevance.

BATTERY APPARATUS

TECHNICAL FIELD

The present invention relates to battery apparatuses.

BACKGROUND ART

As an example of a method for setting identification information in a network having a plurality of devices connected thereto, one disclosed in Japanese Unexamined Patent Application, Publication No. 2004-193643 (PTL 1) is known in the related art. PTL 1 discloses a technique in which a terminal to be newly connected transmits a connection request message containing provisional identification information to other terminals and sets the provisional identification information as its identification information unless it receives, as a response thereto, a conflict message indicating a terminal having identification information conflicting with the provisional identification information from the other terminals that have received the connection request message.

In addition, for example, Publication of Japanese Patent No. 3549676 (PTL 2) discloses a technique in which a central unit regularly transmits an allocation request message for identification information to a plurality of terminals connected thereto via a network and allocates new identification information to a terminal newly connected to the network if the central unit receives a reply to the allocation request message from the new terminal.

CITATION LIST

Patent Literature

{PTL 1}
Japanese Unexamined Patent Application, Publication No. 2004-193643
{PTL 2}
Publication of Japanese Patent No. 3549676

SUMMARY OF INVENTION

Technical Problem

The invention disclosed in PTL 1 above, however, has a problem in that it cannot manage identification information in ascending or descending order because the terminal to be newly connected generates a request message using provisional identification information.

The invention disclosed in PTL 2 above, on the other hand, has a problem in that it imposes a communication load because it regularly transmits an allocation request message.

An object of the present invention, which has been made to solve the above problems, is to provide a battery apparatus capable of avoiding an increased communication load and allocating identification information matching the physical connection order of row batteries.

Solution to Problem

To solve the above problems, the present invention employs the following solutions.

The present invention provides a battery apparatus including a row battery group including a plurality of series-connected row batteries including one or more battery cells; a plurality of battery management means, corresponding to the individual row batteries, for managing the battery statuses of the corresponding row batteries; central management means for granting unique identification information to the individual battery management means and acquiring information about the battery statuses of the row batteries from the respective battery management means for management; second communication lines with which the plurality of battery management means are daisy-chained; a first communication line with which, of the plurality of battery management means, the battery management means located at one end is connected to the central management means; and a plurality of connection switching means, provided in the individual second communication lines between the battery management means, for switching the connection and disconnection between the battery management means. All the connection switching means are turned off in an initial state, and each of the battery management means, upon determination of identification information thereof through communication with the central management means, stores the determined identification information and turns on the connection switching means between the battery management means and another battery management means located immediately downstream thereof to enable the other battery management means to communicate with the central management means.

In this configuration, of the plurality of battery management means for managing the battery statuses of the individual row batteries, the battery management means located at one end is connected to the central management means with the first communication line, and the individual battery management means are daisy-chained with the second communication lines. The plurality of connection switching means are provided in the individual second communication lines to switch the connection and disconnection between the battery management means, and upon granting of identification information to each of the battery control means through communication with the central management means, the battery control means turns on the connection switching means between the battery management means and another battery management means located immediately downstream thereof to enable the other battery management means to communicate with the central management means. Thus, in granting of identification information, identification information is granted to the most upstream battery management means connected to the central management means via the first communication line, and then the most upstream battery management means turns on the connection switching means between the battery management means and another battery management means located immediately downstream thereof to enable the other battery management means to communicate with the central management means. In this way, the central management means grants identification information in order from the battery management means located upstream.

In the above battery apparatus, at the start of granting of identification information, the central management means may transmit a first request requesting allocation of identification information to the battery management means connected thereto via the first communication line. The battery management means that has received the first request may transmit a first response containing identification information that the battery management means possesses to the central management means and turn on the connection switching means between the battery management means and another battery management means located immediately downstream thereof to enable the other battery management means to communicate with the central management means. The central management means that has received the first response may store the identification information contained in the first response received from the battery management means and transmit a second request containing next identification information generated on the basis of a predetermined rule to the other battery management means. The other battery management means that has received the second request may store the identification information contained in the received second request as identification information thereof, transmit a second response notifying the central management means that the battery management means has stored the identification information to the central management means, and turn on the connection switching means between the battery management means and another battery management means located immediately downstream thereof.

This allows the central management means to smoothly grant identification information to each of the battery management means.

The present invention provides a battery apparatus including a row battery group including a plurality of series-connected connected row batteries including one or more battery cells; a plurality of battery management means, corresponding to the individual row batteries, for managing the battery statuses of the corresponding row batteries; central management means for granting unique identification information to the individual battery management means and acquiring information about the battery statuses of the row batteries from the respective battery management means for management; second communication lines with which the plurality of battery management means are daisy-chained; and a first communication line with which, of the plurality of battery management means, the battery management means located at one end is connected to the central management means. The battery management means other than the most upstream battery management means connected to the central management means via the first communication line are powered off in an initial state, and each of the battery management means, upon determination of identification information thereof through communication with the central management means, stores the determined identification information and transmits a power-on instruction to another battery management means located immediately downstream thereof to enable the other battery management means to communicate with the central management means.

In this configuration, of the plurality of battery management means for managing the battery statuses of the individual row batteries, the battery management means located at one end is connected to the central management means with the first communication line, and the individual battery management means are daisy-chained with the second communication lines. Upon granting of identification information to each of the battery control means through communication with the central management means, the battery control means transmits a power-on instruction to another battery management means located immediately downstream thereof to enable the other battery management means to communicate with the central management means. Thus, in granting of identification information, identification information is granted to the most upstream battery management means connected to the central management means via the first communication line, and then the most upstream battery management means powers on another battery management means located immediately downstream thereof to enable the other battery management means to communicate with the central management means. In this way, the central management means grants identification information in order from the battery management means located upstream.

In the above battery apparatus, at the start of granting of identification information, the central management means may transmit a first request requesting allocation of identification information to the battery management means connected thereto via the first communication line. The battery management means that has received the first request may transmit a first response containing identification information that the battery management means possesses to the central management means and transmits a power-on instruction to another battery management means located immediately downstream thereof to enable the other battery management means to communicate with the central management means. The central management means that has received the first response may store the identification information contained in the first response received from the battery management means and transmit a second request containing next identification information generated on the basis of a predetermined rule to the other battery management means. The other battery management means that has received the second request may store the identification information contained in the received second request as identification information thereof, transmit a second response notifying the central management means that the battery management means has stored the identification information to the central management means, and transmit a power-on instruction to another battery management means located immediately downstream thereof.

This allows the central management means to smoothly grant identification information to each of the battery management means.

In the above battery apparatus, the central management means may allocate the identification information in ascending or descending order.

Thus, if the central management means allocates the identification information in ascending or descending order, it can allocate the identification information in ascending or descending order in association with the order in which the batteries connected to the central management means are arranged so that the battery status information acquired from the individual battery management means can be associated with the order in which they are physically arranged, thus allowing easy management.

In the above battery apparatus, the central management means may transmit the second request until there is no battery management means that does not transmit the second response.

Thus, if the central management means transmits the second request until there is no battery management means that does not transmit the second response, it can detect all battery management means.

In the above battery apparatus, the central management means may store the number of battery management means in advance and, when granting the identification information, generate an error output if the number of pieces of identification information granted to the battery management means differs from the number of battery management means stored in advance.

Thus, because the central management means stores the number of battery management means in advance, it compares the number of pieces of identification information, granted to the battery management means, sent from the battery management means with the number stored in advance and generates an error output if they differ. This allows an error in the battery management means to be output by an easy method.

In the above battery apparatus, the central management means may regrant identification information to each of the battery management means if the number of battery management means that the central management means stores is changed.

Thus, because the central management means regrants identification information to the battery management means if the number of battery management means that the central management means stores is changed, correct identification information can be managed even if the number of battery management means is changed during operation. In addition, the number of battery management means is changed by, for example, a maintenance tool.

Advantageous Effects of Invention

The present invention provides the advantageous effect of avoiding an increased communication load and enabling allocation of identification information matching the physical connection order of the row batteries.

DESCRIPTION OF EMBODIMENTS

An embodiment of a battery apparatus according to the present invention will be described below with reference to the drawings.

First Embodiment

Figure 1:
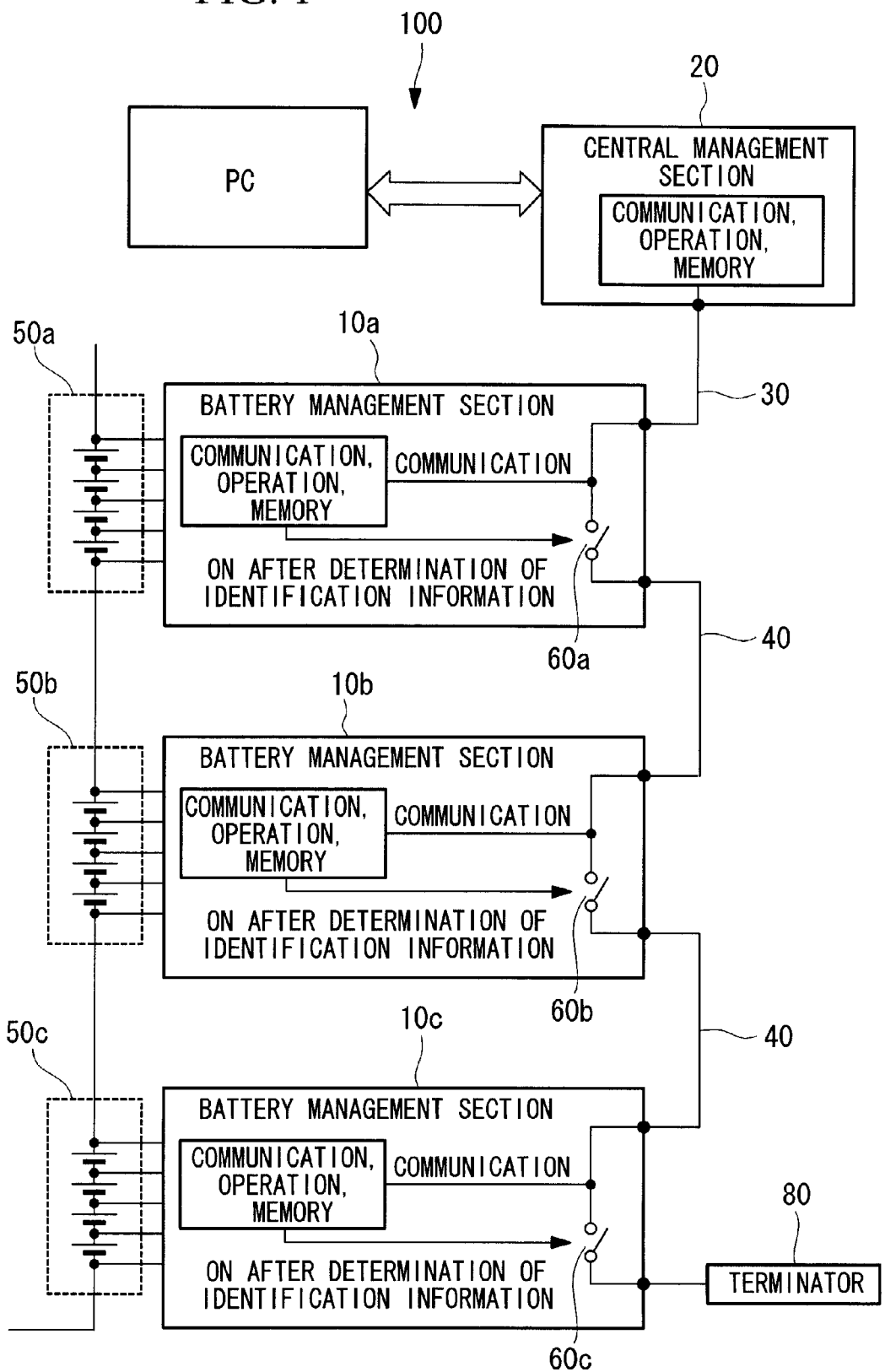
FIG. 1 is a diagram schematically showing the configuration of a battery apparatus according to a first embodiment of the present invention.

FIG. 1 is a diagram schematically showing the configuration of a battery apparatus according to a first embodiment of the present invention.

As shown in FIG. 1, a battery apparatus 100 according to this embodiment has a main configuration including a plurality of battery management sections (battery management means) 10a, 10b, and 10c; a central management section (central management means) 20; a first communication line 30; second communication lines 40; a row battery group including a plurality of row batteries 50a, 50b, and 50c; and switching devices 60a, 60b, and 60c.

The row batteries 50a, 50b, and 50c are basically composed of a battery cell or a plurality of series-connected battery cells. Each battery cell has a voltage sensor (not shown) for detecting the voltage of the battery cell and a temperature sensor (not shown) for detecting the temperature thereof. Detection results from the voltage sensor and the temperature sensor are output to the battery management section 10 provided for each row battery 50. Whereas the row batteries 50 are each composed of four battery cells in this embodiment, as shown in FIG. 1, the present invention is not limited thereto. In addition, the above secondary batteries are, for example, lithium-ion batteries or lead-acid batteries.

The battery management sections 10a, 10b, and 10c are daisy-chained with the second communication lines 40, and of the plurality of battery management sections 10a, 10b, and 10c, the battery management section located at one end, namely, the battery management section 10a, is connected to the central management section 20 with the first communication line 30. The plurality of battery management sections 10a, 10b, and 10c have the plurality of connection switching sections (connection switching means) 60a, 60b, and 60c, respectively, in the second communication lines 40 between the battery management sections to switch the connection and disconnection between the battery management sections. In addition, all the connection switching sections 60a, 60b, and 60c are turned off in the initial state.

Each of the battery management sections 10a, 10b, and 10c, upon determination of its identification information through communication with the central management section 20, stores the determined identification information and turns on the connection switching section between that battery management section and another battery management section located immediately downstream thereof to enable the other battery management section to communicate with the central management section 20.

For example, upon receiving a request for allocation of identification information, namely, a first request, from the central management section 20 (details will be described later), the battery management section 10a transmits a first response containing identification information that the battery management section 10a possesses to the central management section 20 and turns on the connection switching section 60a between the battery management section 10a and another battery management section 10b located immediately downstream thereof to enable the other battery management section 10b to communicate with the central management section 20. In this embodiment, the central management section 20 side is defined as being upstream, and the side opposite to the central management section 20 is defined as being downstream, as viewed from the battery management section 10a connected to the central management section 20 with the first communication line.

The central management section 20 grants unique identification information to each of the battery management sections 10a, 10b, and 10c and, after granting identification information, acquires information about the battery statuses of the row batteries 50a, 50b, and 50c from the battery management sections 10a, 10b, and 10c, respectively, for management. In this embodiment, the central management section 20 allocates the above unique identification information in ascending order.

For example, at the start of granting of identification information, the central management section 20 transmits a first request requesting allocation of identification information to the battery management section 10a via the first communication line 30. Upon receiving a response to the first request, namely, a first response, from the battery management section 10a, the central management section 20 stores the identification information contained in the first response in association with the battery management section 10a, generates a second request containing next identification information (for example, an identification number), and transmits the second request to another battery management section 10b connected by the operation of the battery management section 10a.

Upon receiving a second response from the battery management section 10b, the central management section 20 stores the identification information contained in the second response in association with the battery management section 10b, generates a second request containing information next to that identification information, and transmits the second request to another battery management section 10c connected by the operation of the battery management section 10b. Furthermore, the central management section 20 repeatedly transmits second requests a predetermined number of times (for example, three times) and, if no second response is received, determines that there is no battery management section that is to return a second response and terminates the allocation of identification information.

In this way, the central management section 20 allocates identification information in order of the battery management sections 10a, 10b, and 10c and stores the identification information for the battery management sections 10a, 10b, and 10c in association with the battery management sections 10a, 10b, and 10c.

In addition, the central management section 20 may store the number of battery management sections to be connected in advance and, when granting identification information, may generate an error output if the number of pieces of identification information granted to the battery management sections differs from the number of battery management sections 10 stored in advance.

The number of battery management sections to be connected may be freely rewritable by the user or may be rewritable by a dedicated tool such as software.

After completing the allocation of identification information, the central management section 20 starts normal communication with the battery management sections 10. Specifically, after granting identification information, the central management section 20 acquires battery information about the row batteries 50a, 50b, and 50c connected to the battery management sections 10a, 10b, and 10c, respectively, from the battery management sections 10a, 10b, and 10c for management. The battery information is, for example, a voltage value received from the voltage sensor provided for each row battery and a temperature value received from the temperature sensor provided for each row battery.

Thus, the central management section 20 manages the battery status of each row battery and, for example, if any row battery is in an abnormal condition (such as an abnormal terminal-to-terminal voltage or overcurrent), outputs error information to, for example, a PC interconnected to the central management section 20.

Next, the operation of the battery apparatus 100 according to this embodiment will be described using FIG. 1.

First, at the start of granting of identification information, the central management section 20 generates a first request requesting allocation of identification information and transmits the first request to the battery management section 10a connected thereto via the first communication line 30. The battery management section 10a that has received the first request generates a response containing identification information (for example, "0001") that the battery management section 10a possesses, namely, a first response, transmits the first response to the central management section 20, and turns on the connection switching section 60a between the battery management section 10a and the battery management section 10b located immediately downstream thereof to enable the battery management section 10b to communicate with the central management section 20.

The central management section 20 that has received the first response stores the identification information, for the battery management section 10a, contained in the first response in association with the battery management section 10a. The central management section 20 then transmits a second request containing the next identification information "0002" generated from the identification information "0001" for the battery management section 10a on the basis of a predetermined rule to the battery management section 10b.

The battery management section 10b that has received the second request stores the identification information "0002" contained in the received second request as its identification information, transmits a second response notifying the central management section 20 that the battery management section 10b has stored the identification information to the central management section 20, and turns on the connection switching section 60b between the battery management section 10b and the battery management section 10c located immediately downstream thereof.

Thus, the identification information "0003" is allocated to the battery management section 10c by the same process.

As described above, in the battery apparatus according to this embodiment, the battery management section 10a is connected to the central management section 20 with the first communication line 30, and in granting of identification information, identification information is granted to the most upstream battery management section 10a connected to the central management section 20 via the first communication line 30, and then the most upstream battery management section 10a turns on the connection switching section 60a between the battery management section 10a and another battery management section 10b located immediately downstream thereof to enable the other battery management section 10b to communicate with the central management section 20. In this way, the central management section 20 grants identification information in order from the battery management section 10a located upstream to allocate the identification information in the order in which the batteries are physically arranged. This allows smooth allocation of identification information to the battery management sections 10a, 10b, and 10c.

At the same time, the identification information can be allocated in ascending or descending order so that the order of the identification information matches the order in which the row batteries are connected. In this case, for example, if any row battery is in an abnormal condition, it is possible to quickly determine which row battery and battery cell is in an abnormal condition.

In addition, because the central management section 20 stores the number of battery management sections to be connected in advance, it can output a lack of the number of battery management sections 10 connected in an easy manner by comparing the number of battery management sections to be connected, stored in advance, with the number of pieces of identification information granted.

Whereas the processing for the battery apparatus in the embodiment described above is assumed to be implemented by hardware, the present invention is not limited thereto. For example, the processing can be separately implemented by software (battery apparatus control program) based on output signals from the sensors. In this case, the battery apparatus includes a CPU, a main storage device such as a RAM, and a computer-readable recording medium on which a program for implementing the entire processing or part thereof is recorded. The CPU retrieves the program recorded on the recording medium and executes manipulations and operations of information to implement the same processing as the hardware described above.

Here, a computer-readable recording medium refers to, for example, a magnetic disk, a magneto-optical disk, a CD-ROM, a DVD-ROM, or a semiconductor memory. In addition, the computer program can be distributed to a computer via a communication network and be executed by the computer that has received the program.

Whereas the central management section 20 in the battery apparatus according to this embodiment stores the number of battery management sections to be connected in advance, the present invention is not limited thereto. For example, the number of battery management sections to be connected may be variable by, for example, a maintenance tool during operation. In this case, additionally, the central management section 20 regrants identification information to each battery management section. This allows all battery management sections to be continuously managed even if the number of battery management sections to be connected is changed during operation.

In addition, whereas the battery management sections 10 are provided for the individual row batteries in the battery apparatus according to this embodiment, the present invention is not limited thereto. For example, it is possible to provide the battery management sections for the individual battery cells, and it is also possible to divide the battery cells into groups and provide the battery management sections 10 for the individual groups.

In addition, whereas three series-connected row batteries have been taken as an example of the row batteries in the battery apparatus according to this embodiment, the present invention is not limited thereto, and particularly, no upper limit is set.

In addition, whereas the central management section 20 repeatedly transmits second requests three times in the battery apparatus according to this embodiment, the present invention is not limited thereto. For example, the number of times second requests are repeatedly transmitted may be freely set by the user.

In addition, the normal terminal-to-terminal voltage range and temperature limits of the battery cells described above may be freely set by design.

In addition, whereas the central management section 20 allocates unique identification information in ascending order, the present invention is not limited thereto. For example, the allocation may be performed in descending order.

In addition, whereas the central management section 20 in the battery apparatus according to this embodiment allocates unique identification information in ascending order, the present invention is not limited thereto. For example, the allocation may be performed in descending order.

Second Embodiment

Next, a second embodiment of the present invention will be described using FIG. 2.

In the first embodiment described above, identification information is allocated to each battery management section by sequentially connecting the second communication lines 40; this embodiment differs in that identification information is sequentially allocated to each battery management section by sequentially powering on each battery management section.

For a battery apparatus 200 according to this embodiment, a description of the points common to the first embodiment will be omitted, and only differing points will be described.

Figure 2:
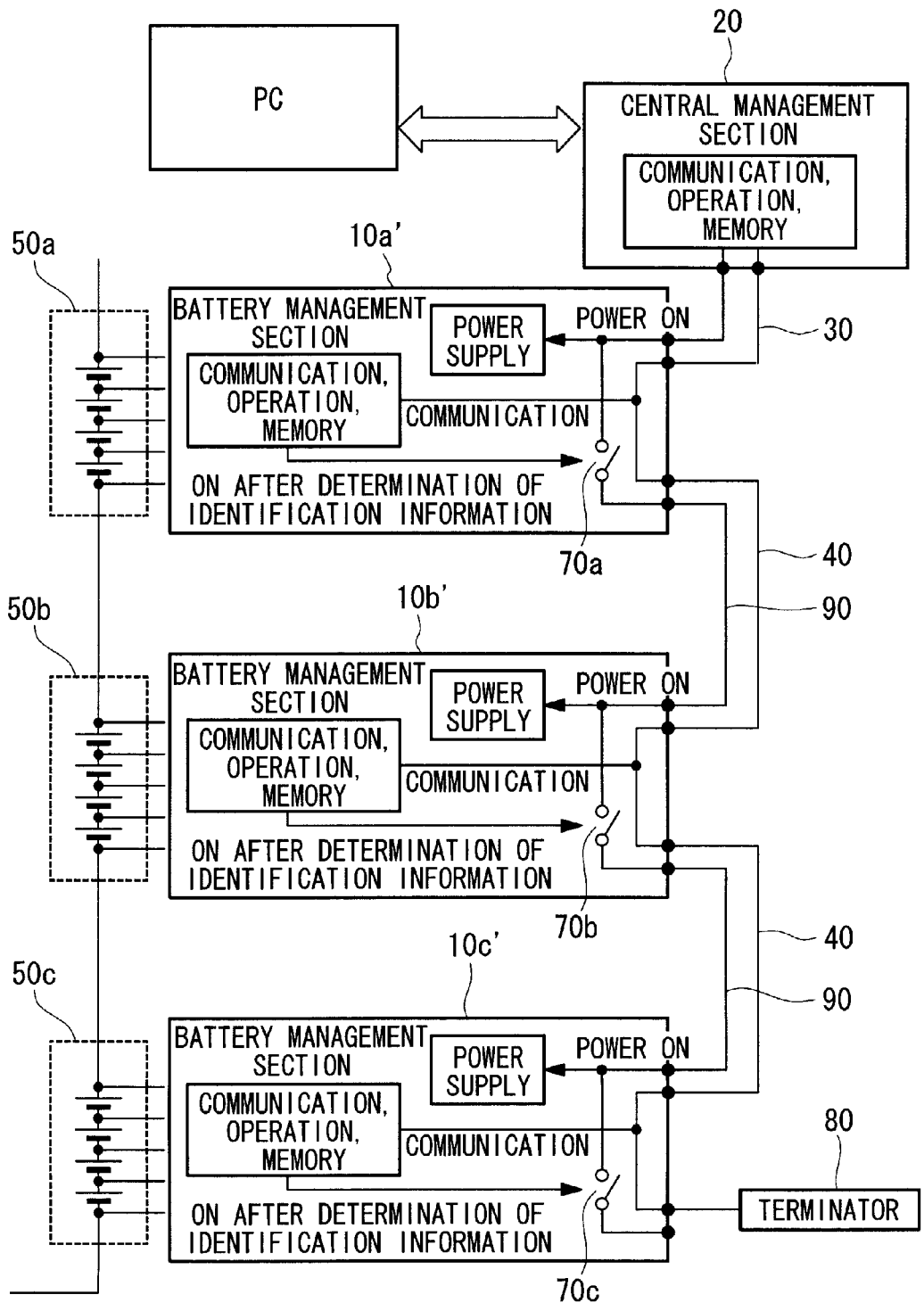
FIG. 2 is a diagram schematically showing the configuration of a battery apparatus according to a second embodiment of the present invention.

As shown in FIG. 2, battery management sections 10$a$', 10$b$', and 10$c$' are daisy-chained with the second communication lines 40, and of the plurality of battery management sections 10$a$', 10$b$', and 10$c$', the battery management section located at one end, namely, the battery management section 10$a$', is connected to the central management section 20 with the first communication line 30. In addition, each of the battery management sections 10$a$', 10$b$', and 10$c$', specifically the battery management section 10$a$, upon determination of its identification information through communication with the central management section 20, stores the determined identification information and powers on another battery management section 10$b$' located immediately downstream thereof. In this embodiment, a connection switching section 70$a$ disposed in a third communication line 90 provided in addition to the second communication lines 40 is turned on, and a signal instructing the battery management section 10$b$' to be powered on is output to the battery management section 10$b$' via the third communication line 90.

Thus, the battery management section 10$b$' is enabled to communicate with the central management section 20 via the second communication lines 40, and identification information is allocated to the battery management section 10$b$' by the same process as in the first embodiment described above. Upon completion of granting of identification information to the battery management section 10$b$', similarly, a signal instructing the battery management section 10$c$' to be powered on is output from the battery management section 10$c$' via the third communication lines 90, thus powering on the battery management section 10$c$'. Thus, the battery management section 10$c$' is enabled to communicate with the central management section 20 via the second communication lines 40, and identification information is allocated to the battery management section 10$c$'.

In this way, as in the first embodiment described above, the desired identification information can be sequentially granted by sequentially powering on the battery management sections 10$a$', 10$b$', and 10$c$'.

REFERENCE SIGNS LIST

10$a$, 10$b$, 10$c$, 10$a$', 10$b$', 10$c$' battery management section
20 central management section
30 first communication line
40 second communication line
50$a$, 50$b$, 50$c$ row battery
60$a$, 60$b$, 60$c$ connection switching section
70$a$, 70$b$, 70$c$ connection switching section
90 third communication line
100 battery apparatus

The invention claimed is:

1. A battery apparatus comprising:
a row battery group including a plurality of series-connected row batteries including one or more battery cells;
a plurality of battery management means, corresponding to the individual row batteries, for managing the battery statuses of the corresponding row batteries;
central management means for granting unique identification information to the individual battery management means and acquiring information about the battery statuses of the row batteries from the respective battery management means for management;
second communication lines with which the plurality of battery management means are daisy-chained;
a first communication line with which, of the plurality of battery management means, the battery management means located at one end is connected to the central management means; and
a plurality of connection switching means, provided in the individual second communication lines between the battery management means, for switching the connection and disconnection between the battery management means;
wherein all the connection switching means are turned off in an initial state; and
each of the battery management means, upon determination of identification information thereof through communication with the central management means, stores the determined identification information and turns on the connection switching means between the battery management means and another battery management means located immediately downstream thereof to enable the other battery management means to communicate with the central management means.

2. The battery apparatus according to claim 1, wherein, at the start of granting of identification information, the central management means transmits a first request requesting allocation of identification information to the battery management means connected thereto via the first communication line;

the battery management means that has received the first request transmits a first response containing identification information that the battery management means possesses to the central management means and turns on the connection switching means between the battery management means and another battery management means located immediately downstream thereof to enable the other battery management means to communicate with the central management means;

the central management means that has received the first response stores the identification information contained in the first response received from the battery management means and transmits a second request containing next identification information generated on the basis of a predetermined rule to the other battery management means; and the other battery management means that has received the second request stores the identification information contained in the received second request as identification information thereof, transmits a second response notifying the central management means that the battery management means has stored the identification information to the central management means, and turns on the connection switching means between the battery management means and another battery management means located immediately downstream thereof.

3. The battery apparatus according to claim 2, wherein the central management means transmits the second request until there is no battery management means that does not transmit the second response.

4. The battery apparatus according to claim 1, wherein the central management means allocates the identification information in ascending or descending order.

5. The battery apparatus according to claim 1, wherein the central management means stores the number of battery management means in advance and, when granting the identification information, generates an error output if the number of pieces of identification information granted to the battery management means differs from the number of battery management means stored in advance.

6. The battery apparatus according to claim 5, wherein the central management means regrants identification information to each of the battery management means if the number of battery management means that the central management means stores is changed.

7. A battery apparatus comprising:
a row battery group including a plurality of series-connected row batteries including one or more battery cells;
a plurality of battery management means, corresponding to the individual row batteries, for managing the battery statuses of the corresponding row batteries;
central management means for granting unique identification information to the individual battery management means and acquiring information about the battery statuses of the row batteries from the respective battery management means for management;
second communication lines with which the plurality of battery management means are daisy-chained; and
a first communication line with which, of the plurality of battery management means, the battery management means located at one end is connected to the central management means;
wherein the battery management means other than the most upstream battery management means connected to the central management means via the first communication line are powered off in an initial state; and
each of the battery management means, upon determination of identification information thereof through communication with the central management means, stores the determined identification information and transmits a power-on instruction to another battery management means located immediately downstream thereof to enable the other battery management means to communicate with the central management means.

8. The battery apparatus according to claim 7, wherein, at the start of granting of identification information, the central management means transmits a first request requesting allocation of identification information to the battery management means connected thereto via the first communication line;

the battery management means that has received the first request transmits a first response containing identification information that the battery management means possesses to the central management means and transmits a power-on instruction to another battery management means located immediately downstream thereof to enable the other battery management means to communicate with the central management means;

the central management means that has received the first response stores the identification information contained in the first response received from the battery management means and transmits a second request containing next identification information generated on the basis of a predetermined rule to the other battery management means; and the other battery management means that has received the second request stores the identification information contained in the received second request as identification information thereof, transmits a second response notifying the central management means that the battery management means has stored the identification information to the central management means, and transmits a power-on instruction to another battery management means located immediately downstream thereof.

* * * * *